(12) United States Patent
Mizuhara et al.

(10) Patent No.: US 9,865,679 B2
(45) Date of Patent: Jan. 9, 2018

(54) COMPOUND SEMICONDUCTOR DEVICE, METHOD FOR PRODUCING SAME, AND RESIN-SEALED TYPE SEMICONDUCTOR DEVICE

(71) Applicant: Panasonic Intellectual Property Management Co., Ltd., Osaka (JP)

(72) Inventors: Hideki Mizuhara, Kyoto (JP); Yoshihiro Matsushima, Shiga (JP); Shinichi Oohashi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/880,975

(22) Filed: Oct. 12, 2015

(65) Prior Publication Data

US 2016/0035828 A1 Feb. 4, 2016

Related U.S. Application Data

(63) Continuation of application No. PCT/JP2014/001691, filed on Mar. 25, 2014.

(30) Foreign Application Priority Data

Apr. 17, 2013 (JP) .................................. 2013-086339

(51) Int. Cl.
*H01L 29/06* (2006.01)
*H01L 23/29* (2006.01)
(Continued)

(52) U.S. Cl.
CPC ........ *H01L 29/0657* (2013.01); *B23K 26/361* (2015.10); *H01L 21/268* (2013.01);
(Continued)

(58) Field of Classification Search
CPC . H01L 21/268; H01L 23/3142; H01L 23/293; H01L 2924/00; H01L 23/0002;
(Continued)

(56) References Cited

U.S. PATENT DOCUMENTS 6,326,676 B1 12/2001 Ohde et al.
6,368,943 B1 4/2002 Ohde et al.
(Continued)

FOREIGN PATENT DOCUMENTS

CN 202712260 U 1/2013
JP 9-306872 11/1997
(Continued)

OTHER PUBLICATIONS

International Search Report of PCT application No. PCT/JP2014/001691 dated May 20, 2014.
(Continued)

*Primary Examiner* — Caridad Everhart
(74) *Attorney, Agent, or Firm* — McDermott Will & Emery LLP (57) ABSTRACT

In a semiconductor element having a compound semiconductor layer epitaxially grown on a silicon substrate, an object is to suppress generation of deficiency or problems of reliability deriving from the ends of the element that are generated when dividing into semiconductor devices by dicing. A compound semiconductor layer epitaxially grown on a silicon substrate is formed via a buffer layer made of aluminum nitride. In the periphery of the semiconductor device, a scribe lane is present to surround a semiconductor element region. Along the scribe lane, the aluminum nitride layer is covered with a coating film for protection against humidity and moisture.

12 Claims, 9 Drawing Sheets

(51) Int. Cl.
*H01L 23/31* (2006.01)
*H01L 21/78* (2006.01)
*H01L 21/268* (2006.01)
*B23K 26/361* (2014.01)

(52) U.S. Cl.
CPC ............ *H01L 21/78* (2013.01); *H01L 23/293* (2013.01); *H01L 23/3142* (2013.01); *H01L 2924/0002* (2013.01)

(58) Field of Classification Search
CPC ................ H01L 21/78; H01L 29/0657; H01L 2924/0002; B23K 26/362; B23K 26/36
See application file for complete search history.

(56) References Cited

U.S. PATENT DOCUMENTS

| | | | |
|---|---|---|---|
| 6,399,463 B1 | 6/2002 | Glenn et al. | |
| 2005/0001225 A1 | 1/2005 | Yoshimura et al. | |
| 2005/0227455 A1* | 10/2005 | Park | B23K 26/0732 438/458 |
| 2006/0166478 A1* | 7/2006 | Sugahara | H01S 5/227 438/602 |
| 2007/0284762 A1* | 12/2007 | Barber | H01L 21/78 257/797 |
| 2008/0070380 A1 | 3/2008 | Kusunoki | |
| 2013/0069072 A1* | 3/2013 | Tomabechi | H01L 29/2003 257/76 |
| 2013/0234149 A1* | 9/2013 | Halderman | H01L 33/32 257/76 |

FOREIGN PATENT DOCUMENTS

| | | |
|---|---|---|
| JP | 10-321908 | 12/1998 |
| JP | 11-214335 | 8/1999 |
| JP | 2002-222777 | 8/2002 |
| JP | 2004-186278 A | 7/2004 |
| JP | 2006-156429 | 6/2006 |
| JP | 2006-302939 | 11/2006 |
| JP | 2011-082546 A | 4/2011 |
| JP | 2011-210915 | 10/2011 |
| JP | 2013-065720 A | 4/2013 |

OTHER PUBLICATIONS

English Translation of Chinese Search Report dated Apr. 28, 2017 for the related Chinese Patent Application No. 201480021714.9.

* cited by examiner

Electron microscope image 1

Electron microscope image 1

Electron microscope image 1

COMPOUND SEMICONDUCTOR DEVICE, METHOD FOR PRODUCING SAME, AND RESIN-SEALED TYPE SEMICONDUCTOR DEVICE

BACKGROUND OF THE INVENTION

1. Field of the Invention

The present disclosure relates to a compound semiconductor device in which a compound semiconductor layer epitaxially grown on a silicon substrate is formed via a buffer layer made of aluminum nitride, as well as to a method for producing the same, and a resin-sealed type semiconductor device.

2. Description of the Related Art

In recent years, as a material of a semiconductor device, development of a nitride-based semiconductor material, which is a wide-bandgap semiconductor, is actively carried out. As a characteristic feature of the wide-bandgap semiconductor, it can be mentioned that the wide-bandgap semiconductor has an insulation breakdown voltage larger than that of silicon (Si), which is a general semiconductor, by an order of magnitude.

With conventional Si, a drift layer in which electrons travel needs to be made long in order to obtain a power semiconductor device having a high breakdown voltage. In contrast, gallium nitride (GaN) provides an equivalent breakdown voltage with a short drift layer (about $\frac{1}{10}$ of Si). In this case, when a situation of allowing an electric current to flow in the semiconductor device is considered, the drift layer becomes a resistance layer, so that the on-resistance of the semiconductor device becomes smaller when the drift layer is shorter. Theoretically, assuming that the mobility and the dielectric constant of a semiconductor are of the same degree, the on-resistance of the semiconductor device exhibiting a certain predetermined breakdown voltage is inversely proportional to the cube of the insulation breakdown electric field that the semiconductor material has. In other words, with the same chip area, an on-resistance lower by about $\frac{1}{1000}$ can be achieved in a GaN device as compared with a Si device.

A nitride-based semiconductor material can form various mixed crystals with GaN, aluminum nitride (AlN), and indium nitride (InN), so that the nitride semiconductor material can make a heterojunction as with a conventional arsenic semiconductor material such as gallium arsenic (GaAs). In particular, the heterojunction of the nitride-based semiconductor has a characteristic feature such that high concentration of carriers are generated at the interface by spontaneous polarization or piezo-polarization even in a state in which doping of impurities is absent. As a result, in a lateral-type device in which an electric current is allowed to flow in a direction parallel to the silicon substrate using the heterojunction of GaN/AlGaN, a device for large electric power having a low on-resistance with a large electric current can be achieved.

Further, the nitride-based semiconductor material can be epitaxially grown on a silicon substrate via a buffer layer made of aluminum nitride. In other words, though it is necessary to use an expensive silicon carbide (SiC) substrate with the same wide-bandgap semiconductor material in the case of a SiC device, it is possible to use a silicon substrate in the case of a nitride-based semiconductor device, so that reduction of costs and increase in the diameter can be achieved.

In the meantime, the nitride-based semiconductor device in which the nitride-based semiconductor layer has been formed on the silicon substrate (wafer) is divided into semiconductor devices by performing dicing along a scribe lane as with a conventional silicon device or GaAs device. In this dicing step, after the wafer is bonded to a dicing tape, the wafer is subjected to a cutting process along the scribe lane while a thin-type grindstone having a disk shape, which is known as a dicing blade, is rotated at a high speed.

In this dicing step, fragmentation, cracks, and crystal defects of the semiconductor layer, which are called chipping, are generated in the scribe lane if a blade kind, a rotation number, a dicing speed, and the like are not appropriately selected. Further, when the chipping or crystal defects generated in the scribe lane reach an element formation region within the semiconductor device, deficiency of electric characteristics or deficiency of reliability caused by penetration of moisture is generated.

Generally, the blade kind, the rotation number, and the dicing speed are appropriately selected in order to eliminate deficiency generation in the semiconductor device caused by chipping or crystal defects. A scribe lane width is set so that the deficiency may remain within the scribe lane even when chipping or crystal defects are generated or when moisture penetrates via the buffer layer.

In the silicon device, a structure of suppressing chipping in the semiconductor device is known. For example, PTL 1 discloses a structure in which a film is formed on a scribe lane between a plurality of semiconductor elements formed on a semiconductor wafer. According to this structure, progression of a stress that generates the chipping can be absorbed or alleviated with a wall of this film, so that suppression of the chipping can be expected.

On the other hand, in a nitride-based compound semiconductor device, a structure in which an aluminum nitride layer is formed as a surface protection film is known. For example, PTL 2 discloses a structure in which an AlN layer is formed as a surface protection film on an upper-side surface of an AlGaN layer. According to this production method, the upper-side surface of the AlGaN layer is covered with the AlN layer before cracks are generated, so that it can be expected that the surface will be a flat surface without cracks.

CITATION LIST

Patent Literatures

PTL 1: Unexamined Japanese Patent Publication No. 2006-302939

PTL 2: Unexamined Japanese Patent Publication No. 2006-156429

However, in a nitride-based semiconductor device having a nitride-based semiconductor layer epitaxially grown on a silicon substrate, chipping or crystal defects at the end of the nitride-based compound semiconductor are liable to be generated to a degree more than in the silicon device or the GaAs device when the nitride-based semiconductor layer is subjected to dicing. Therefore, there are cases in which the generation of deficiency and deterioration of reliability caused by chipping or crystal defects cannot be sufficiently suppressed by a general procedure such as described above. The reason therefor is as follows. Due to the difference of lattice constant and thermal expansion coefficient between silicon and the nitride-based semiconductor such as GaN, a large stress is generated near an interface between the silicon substrate and the nitride-based semiconductor layer. When a mechanical shock at the time of dicing is applied near the interface between the silicon substrate and the nitride-based semiconductor layer, cracks and crystal defects are generated with this interface serving as a starting point.

Further, the larger the thickness of the epitaxially grown nitride-based semiconductor layer is, the larger the stress will be. Accordingly, the number of sites where chipping or crystal defects are generated increases, and the size of chipping or crystal defects also increases.

Figure 5:
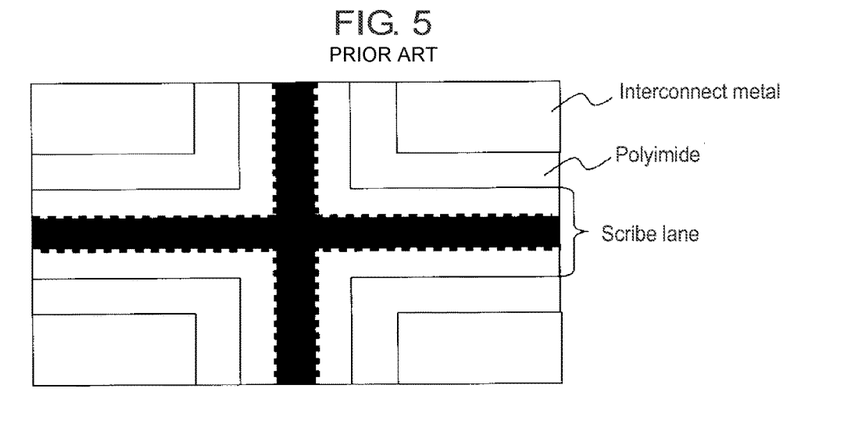
FIG. 5 is a schematic plan view after a conventional semiconductor device having a nitride-based semiconductor layer has been formed by dicing.
Figure 6:
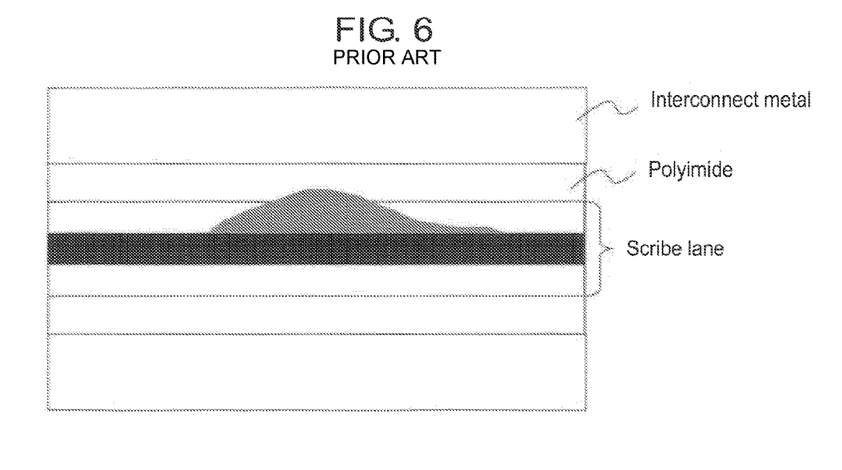
FIG. 6 is a schematic plan view in which deficiency caused by chipping have been generated in a conventional semiconductor device having a nitride-based semiconductor layer.

FIG. 5 shows a schematic plan view when a nitride-based semiconductor layer epitaxially grown on a silicon substrate is subjected to dicing. In FIG. 5, a large number of minute chippings are generated along the dicing line. Among these, some chippings are generated going beyond the scribe lane and reaching the surface protection film of the element, as shown in FIG. 6. In this case, the outlook of the semiconductor device will be also deficient.

The buffer layer "aluminum nitride" used in epitaxially growing the nitride-based semiconductor layer on the silicon substrate reacts with moisture to provoke a reaction of $AlN + 3H_2O \rightarrow Al(OH)_3 + NH_3$. This causes a problem in that the properties are deteriorated by the humidity or moisture penetrating through the end of the element.

In the case of sealing the nitride-based semiconductor element with a resin (including the cases of "incorporation into a component-incorporated substrate" and "under/side-filling sealing of flip-chip mounting"), there are problems in that exfoliation is generated at the interface to the sealing resin due to exposure of the nitride-based semiconductor epitaxial film, which has a poor close-adhesiveness to the resin, at the end the element.

Here, in a nitride-based semiconductor device having a nitride-based semiconductor layer epitaxially grown on a silicon substrate, it can be considered to prevent chipping, crystal defects, or moisture penetration into the semiconductor element from reaching an active region of the element by widely setting the scribe lane width further to be about 150 μm. However, when the scribe lane width is increased, the number of chips that can be collected from one sheet of wafer will be smaller.

There can be considered a method of removing the nitride-based semiconductor layer in the scribe lane by dry etching or the like before the scribe lane is diced. However, in order to achieve an element having a high breakdown voltage of not less than 500 V, the thickness of the nitride-based semiconductor layer having a high resistance that is grown on the electrically conductive silicon substrate needs to be about not less than 4 μm, so that it is difficult to remove such a thick nitride-based semiconductor layer by etching.

SUMMARY OF THE INVENTION

The present disclosure has been made in view of such circumstances, and an object thereof is to provide a semiconductor device having a nitride-based semiconductor layer epitaxially grown on a silicon substrate or the like on the surface side, wherein the semiconductor device has a structure in which the chipping and crystal defects generated at the time of dicing can be suppressed even when the scribe lane width is not set to be large or when the nitride-based semiconductor layer of the scribe lane is not etched, and in which aluminum nitride is not exposed at the end of the element.

In order to solve the aforementioned problems, a compound semiconductor device according to the disclosure of the present application is a compound semiconductor device which is a compound semiconductor chip having a compound semiconductor layer epitaxially grown on a substrate via an aluminum nitride layer, wherein the aluminum nitride layer located below the compound semiconductor layer in the periphery of an element is covered with an amorphous layer or a polycrystal layer.

This allows that the chipping, crystal defects, and moisture penetration can be suppressed in a semiconductor device that has a nitride-based semiconductor layer epitaxially grown on a silicon substrate and is diced along the scribe lane. In other words, when the chipping, crystal defects, and moisture penetration generated from the dicing surface that has been diced along the scribe lane spread, a structure body of suppressing the chipping, crystal defects, and moisture penetration that has been formed at the end of the nitride-based semiconductor layer in the scribe lane suppresses this extension of the chipping, crystal defects, and the like.

The nitride-based compound semiconductor device, the method of producing the same, and the resin-sealed type semiconductor device according to the disclosure of the present application provide an advantage such that, when the chipping, crystal defects, and moisture penetration generated from the dicing surface that has been diced along the scribe lane spread, a structure body of suppressing the chipping, crystal defects, and moisture penetration that has been formed at the end of the nitride-based semiconductor layer in the scribe lane can suppress this extension of the chipping, crystal defects, and the like.

DETAILED DESCRIPTION OF THE PREFERRED EMBODIMENTS

Hereafter, exemplary embodiments of a compound semiconductor device according to the disclosure of the present application, a method for producing the same, and a resin-sealed type semiconductor device will be described with reference to the attached drawings.

Figure 1:
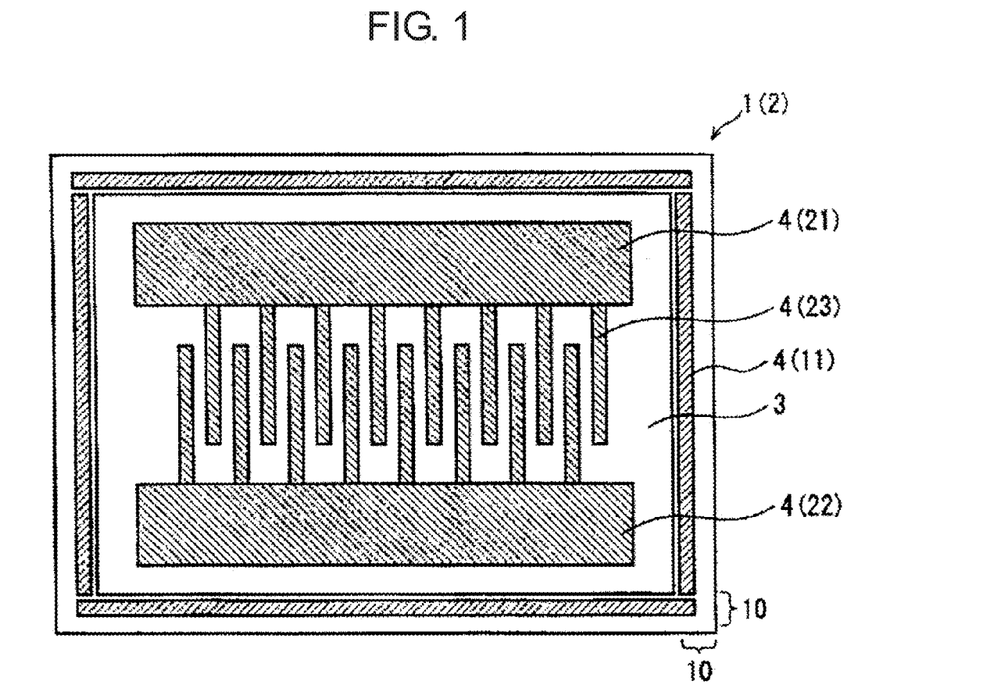
FIG. 1 is a plan view of a semiconductor device according to one exemplary embodiment.

FIG. 1 is a plan view of a semiconductor device according to the present exemplary embodiment. This semiconductor device has been fabricated by dicing a semiconductor wafer in which a plurality of semiconductor devices is arranged.

Figure 2A:
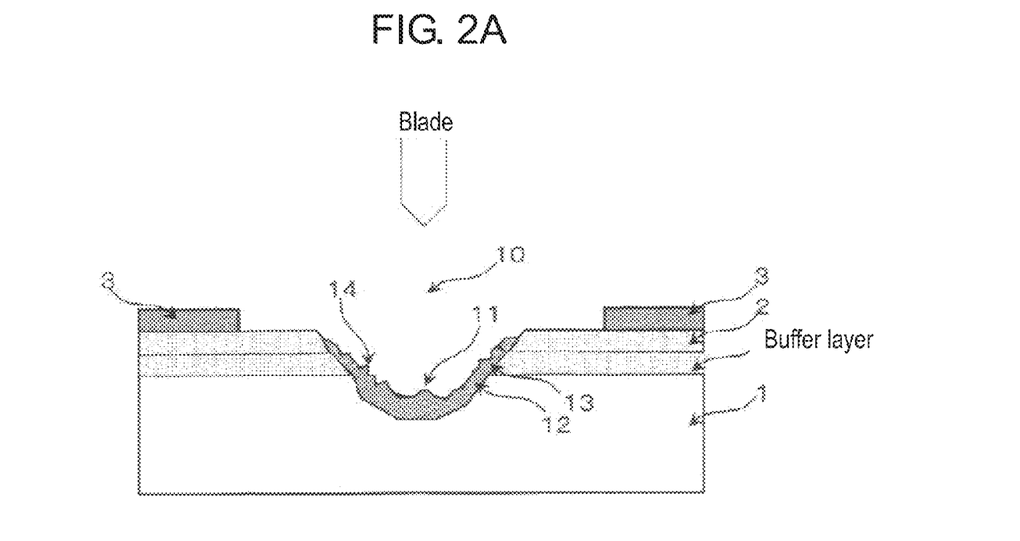
FIG. 2A is a schematic view illustrating a semiconductor wafer before and after dicing, in which a plurality of semiconductor devices according to one exemplary embodiment are arranged.
Figure 2B:
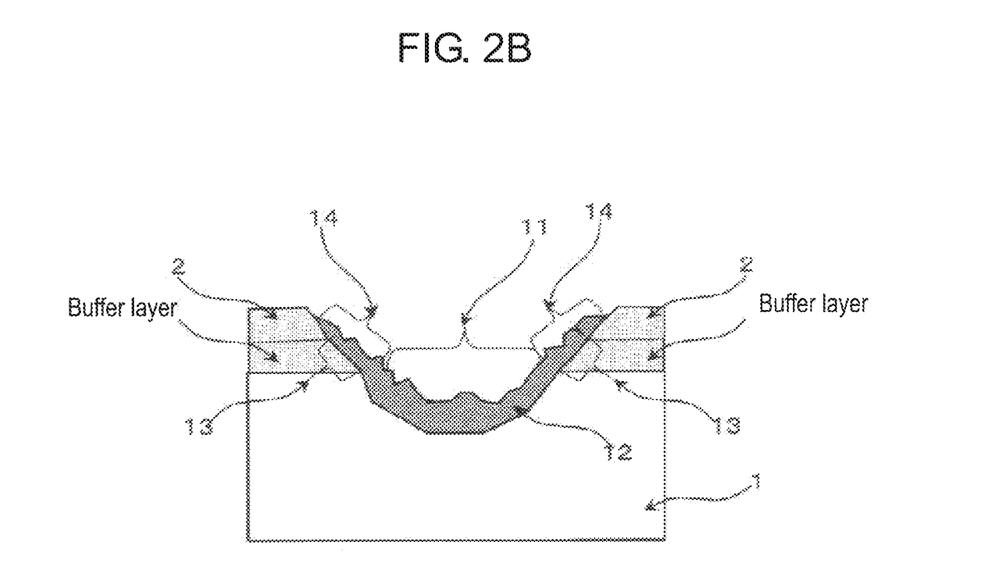
FIG. 2B is a schematic view illustrating a semiconductor wafer before and after dicing, in which a plurality of semiconductor devices according to one exemplary embodiment are arranged.
Figure 2C:
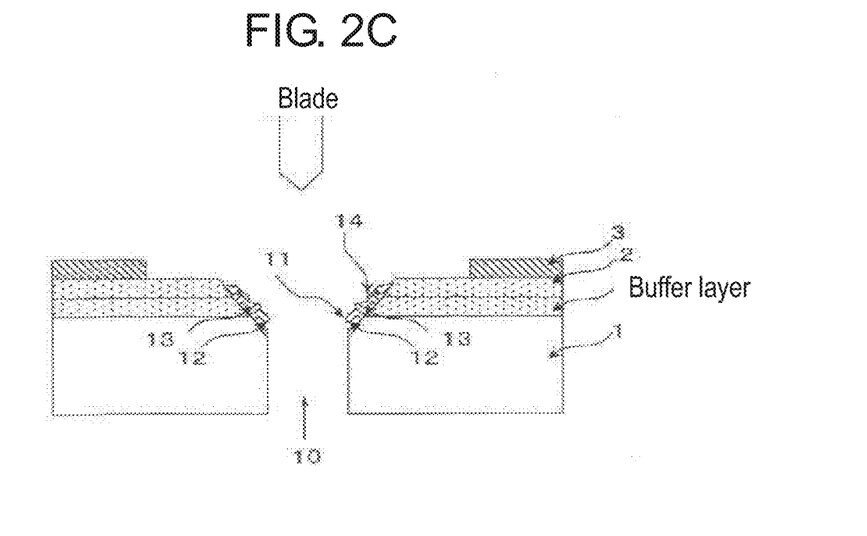
FIG. 2C is a schematic view illustrating a semiconductor wafer before and after dicing, in which a plurality of semiconductor devices according to one exemplary embodiment are arranged.

FIGS. 2A, 2B, and 2C are cross-sectional views each illustrating the semiconductor wafer before and after dicing, in which a plurality of the semiconductor devices shown in FIG. 1 are arranged, where near scribe lane 10 is shown. Referring to FIGS. 2A, 2B, and 2C, in the semiconductor device, nitride-based semiconductor layer 2 including a buffer layer is disposed over a whole surface of silicon substrate 1. In the present exemplary embodiment, the substrate is made of silicon; however, the substrate may be made of any of silicon, sapphire and silicon carbide. On silicon substrate 1, nitride-based semiconductor layer 2 is formed to extend across a semiconductor element formation region and scribe lane 10. Nitride-based semiconductor layer 2 is a layer formed by epitaxially growing a nitride-based semiconductor on silicon substrate 1. Here, in a semiconductor element region having a rectangular shape, nitride-based semiconductor layer 2 includes a buffer layer made of AlN or AlGaN, an operation layer made of GaN or AlGaN, and the like.

Further, referring to FIGS. 1, 2A, 2B, and 2C, surface protection film 3 is disposed in the rectangular semiconductor element region on the surface of nitride-based semiconductor layer 2. Surface protection film 3 is made, for example, of SiN, and is formed by plasma CVD (Chemical vapor deposition). In the periphery of the semiconductor device, scribe lane 10 is present to surround this semiconductor element region. Further, referring to FIG. 1, first pad 21, second pad 22, and comb-shaped interconnect 23 are formed with common interconnect metal layer 4 on surface protection film 3 in the semiconductor element region. Interconnect metal layer 4 has a structure in which Ti layer 4a and Au layer 4b (not illustrated) are stacked, and Au layer 4b has been formed by plating on Ti layer 4a.

The thickness of each layer is, for example, such that the thickness of Ti layer 4a is 0.1 µm, and the thickness of Au layer 4b is 5 µm. Ti layer 4a which is a lower layer has a good close adhesion property to nitride-based semiconductor layer 2 and has a function of strengthening a close adhesion between Au layer 4b and nitride-based semiconductor layer 2.

A part of nitride-based semiconductor layer 2 is present in ring-shaped scribe lane 10 that exists in the periphery of the semiconductor device. Referring to FIGS. 2A, 2B, and 2C, first structure body 11, second structure body 12, third structure body 13, and fourth structure body 14 that suppress chipping, crystal defects, and moisture penetration are formed on the part of nitride-based semiconductor layer 2 that is present in scribe lane 10. Referring to FIG. 1, first structure body 11, second structure body 12, third structure body 13, and fourth structure body 14 that suppress chipping, crystal defects, and moisture penetration are formed along scribe lane 10. In other words, first structure body 11, second structure body 12, third structure body 13, and fourth structure body 14 that suppress chipping, crystal defects, and moisture penetration are formed in a ring shape in the periphery of the semiconductor device. First structure body 11 produces an effect of forming a protection film over the whole buffer layer reaching a point of contact to silicon substrate 1 by being formed widely around a center of the scribe lane with which a dicing blade comes into contact. Second structure body 12 is one formed by re-adhesion after being scattered by ablation phenomenon with a laser beam, and covers a part from around the center of the scribe lane up to a region where the buffer layer is not exposed at an end. Third structure body 13 produces an effect of protecting the buffer layer against humidity and moisture by being formed to cover the end of the buffer layer. Fourth structure body 14 is formed on the surface of a region remaining at the end of the chip after dicing, and produces an effect of improving the close adhesion property at the interface to a sealing resin in the case of sealing with the resin (including the cases of "incorporation into a component-incorporated substrate" and "under/side-filling sealing of flip-chip mounting"). The structures of first structure body 11, second structure body 12, third structure body 13, and fourth structure body 14 that suppress chipping, crystal defects, and moisture penetration are made by first structure body 11 which is a groove/recess reaching silicon substrate 1, second structure body 12 which is an area obtained by partly making the nitride-based compound semiconductor layer be amorphous, third structure body 13 which is a coating film for protecting the "aluminum nitride" barrier layer against humidity and moisture, and fourth structure body 14 which is a nitride-based compound semiconductor layer obtained by surface-roughening (0.05 µm to 1.0 µm) (See FIGS. 2A, 2B, and 2C). Here, first structure body 11, second structure body 12, third structure body 13, and fourth structure body 14 that suppress chipping, crystal defects, and moisture penetration may be formed in a continuous ring shape along ring-shaped scribe lane 10; however, referring to FIG. 1, first structure body 11, second structure body 12, third structure body 13, and fourth structure body 14 may be separated at a corner part or the like of the semiconductor device. A chipping suppression effect is produced even when the width of first structure body 11, second structure body 12, third structure body 13, and fourth structure body 14 that suppress chipping, crystal defects, and moisture penetration is small; however, the effect is larger when the width is larger. However, the scribe lane width will be large when the width of first structure body 11, second structure body 12, third structure body 13, and fourth structure body 14 that suppress chipping, crystal defects, and moisture penetration is set to be too large. The width of first structure body 11, second structure body 12, third structure body 13, and fourth structure body 14 that suppress chipping, crystal defects, and moisture penetration is suitably 5 μm to 25 μm, more preferably 10 μm to 20 μm.

Next, a dicing step will be described which is a characteristic step in the method for producing a compound semiconductor device according to the disclosure of the present application.

The semiconductor device shown in FIG. 1 is fabricated by dicing the semiconductor wafer shown in FIGS. 2A, 2B, and 2C along scribe lane 10 and dividing the semiconductor wafer. This dicing step is carried out as follows: after the semiconductor wafer is bonded to a dicing tape, scribe lane 10 is made to abut against nitride-based semiconductor layer 2 and the semiconductor wafer is subjected to a cutting process by moving the semiconductor wafer in a front-and-back direction of a paper sheet in FIGS. 2A, 2B, and 2C while a thin-type grindstone having a disk shape, which is known as a dicing blade, is rotated at a high speed. In this dicing step, a kind of the blade to be used, a rotation number, a dicing speed, and the like are appropriately set. A blade width of the dicing blade is about 20 μm to 30 μm, and the width of scribe lane 10 that is set in the semiconductor wafer is about 50 μm to 100 μm.

Next, with respect to means, mechanism, and the like for ensuring a stable quality in the dicing step, the effect of suppressing the chipping, crystal defects, and the like by first structure body 11, second structure body 12, third structure body 13, and fourth structure body 14 that suppress the chipping, crystal defects, and moisture penetration, that is, the effect of suppressing the chipping, crystal defects, and the like in the nitride-based semiconductor device having the above configuration will be described.

In the above semiconductor device, nitride-based semiconductor layer 2 is formed to extend across the semiconductor element formation region and scribe lane 10 on silicon substrate 1. Therefore, when chipping, crystal defects, and the like are generated from a dicing surface in dicing nitride-based semiconductor layer 2 and silicon substrate 1 along scribe lane 10, the chipping, crystal defects, and the like spread to the semiconductor element formation region. However, because first structure body 11, second structure body 12, third structure body 13, and fourth structure body 14 that suppress the chipping, crystal defects, and moisture penetration are formed on nitride-based semiconductor layer 2 in scribe lane 10, progression of the chipping, crystal defects, and the like is hindered by first structure body 11, second structure body 12, third structure body 13, and fourth structure body 14 that suppress the chipping, crystal defects, and moisture penetration.

Here, first structure body 11, second structure body 12, third structure body 13, and fourth structure body 14 that suppress the chipping, crystal defects, and moisture penetration, though being formed at an end of the nitride-based semiconductor layer, have a groove/recess that reaches silicon substrate 1, so that damages at the time of dicing are less likely to be propagated to the nitride-based semiconductor layer, and the effect of the function of suppressing the chipping, crystal defects, and moisture penetration is large. Therefore, spreading of the chipping, crystal defects, and the like to a semiconductor element side can be sufficiently suppressed.

Further, first structure body 11, second structure body 12, third structure body 13, and fourth structure body 14 that suppress the chipping, crystal defects, and moisture penetration are formed in a line shape along a boundary between the semiconductor element formation region and the scribe lane, so that the effect of preventing the chipping, crystal defects, and the like can be sufficiently obtained while suppressing the width of scribe lane 10 to be small.

Next, a method for irradiating a laser beam onto scribe lane 10 on which a nitride-based semiconductor film has been formed (film thickness being 4 μm) will be described.

First, a water-soluble protection film is applied by rotation onto a wafer that is in a state in which surface protection film 3 has been formed on a nitride-based semiconductor, and then a laser beam is irradiated along scribe lane 10. In the present exemplary embodiment, the laser beam is allowed to scan in a direction perpendicular to a (111) plane of silicon substrate 1; however, the laser beam may be allowed to scan in other directions. During this process, first structure body 11, second structure body 12, third structure body 13, and fourth structure body 14 that suppress chipping, crystal defects, and moisture penetration can be formed to have a large width when the laser beam is allowed to scan for a plurality of times while shifting a position of the laser beam little by little along the scribe lane. For example, when a processing width per one time of scanning by the laser beam is set to be 10 μm to 30 μm and the position is shifted from outside of the scribe lane towards a center with a shifting pitch of 5 μm to 20 μm, then a finished processing width obtained by scanning for a plurality of times can be made to be 40 μm to 90 μm. Conditions of the laser beam during this process are set in such a manner that, in power-fixed control, a pulse frequency is 40 kHz to 100 kHz; an output is 2 W to 7 W; a sending speed is 100 mm/sec to 400 mm/sec; and a laser focus position ranges from a working surface to a place located away by 0.2 mm thereabove. Thereafter, by washing a wafer surface with pure water, a scattered substance adhering onto an active region can be removed together with the water-soluble protection film. At this time, because the water-soluble protection film has been removed by the laser beam at a chip end, the scattered substance can be allowed to remain as a protection film selectively at the chip end only. Because the scattered substance is scattered away by ablation phenomenon with the laser beam and cooled in a short period of time, the scattered substance becomes an amorphous layer or a polycrystal layer having peaks and valleys with an average pitch of 0.05 μm to 1.0 μm on a surface thereof. Thereafter, scribe lane 10 is made to abut against nitride-based semiconductor layer 2 and the wafer is subjected to a cutting process by moving the wafer in a front-and-back direction of a paper sheet in FIGS. 2A, 2B, and 2C while a thin-type grindstone having a disk shape, which is known as a dicing blade, is rotated at a high speed. The blade width of the dicing blade is about 20 μm to 30 μm, and the width of scribe lane 10 that is set in the semiconductor wafer is about 50 μm to 100 μm.

The compound semiconductor device of the present exemplary embodiment is a compound semiconductor device in which the amorphous layer or the polycrystal layer contains at least silicon or aluminum or both of silicon and aluminum. Therefore, because any of silicon and aluminum has a property of being less liable to proceed to a deep part even when reacting with moisture, the amorphous layer or the polycrystal layer produces an effect of protecting the buffer layer "aluminum nitride" against moisture.

The compound semiconductor device of the present exemplary embodiment is a compound semiconductor device in which the amorphous layer or the polycrystal layer contains silicon at not less than 1 at %. Therefore, because a material containing silicon at more than 1 at % has a further more enhanced property of being less liable to proceed to the deep part even when reacting with moisture, the amorphous layer or the polycrystal layer produces a further more enhanced effect of protecting the buffer layer "aluminum nitride" against moisture.

Figure 3A:
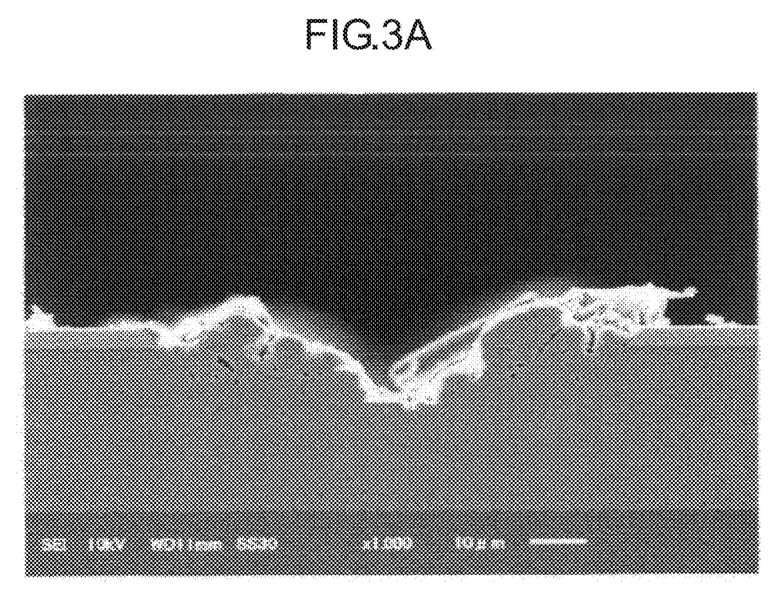
FIG. 3A is a view showing a photograph of a cross-section around a scribe lane before dicing.
Figure 3B:
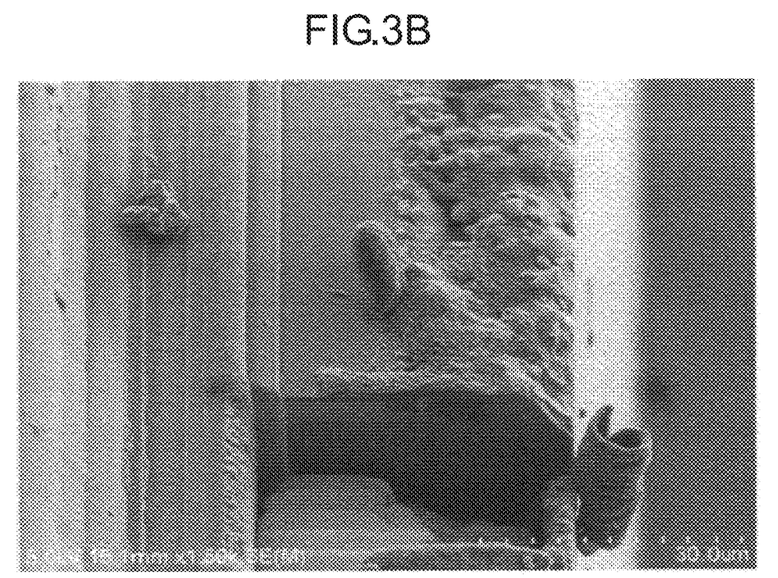
FIG. 3B is a view showing an enlarged photograph of a cut surface after the scribe lane of FIG. 3A has been cut with a blade.

FIGS. 3A and 3B are views each showing a photograph of a cross-section around scribe lane 10 in which first structure body 11, second structure body 12, third structure body 13, and fourth structure body 14 that suppress chipping, crystal defects, and moisture penetration have been formed. FIG. 3A is a view showing a photograph of a cross-section around scribe lane 10 before dicing, and FIG. 3B is a view showing an enlarged photograph of a cut surface after scribe lane 10 of FIG. 3A has been cut with a blade.

Figure 4A:
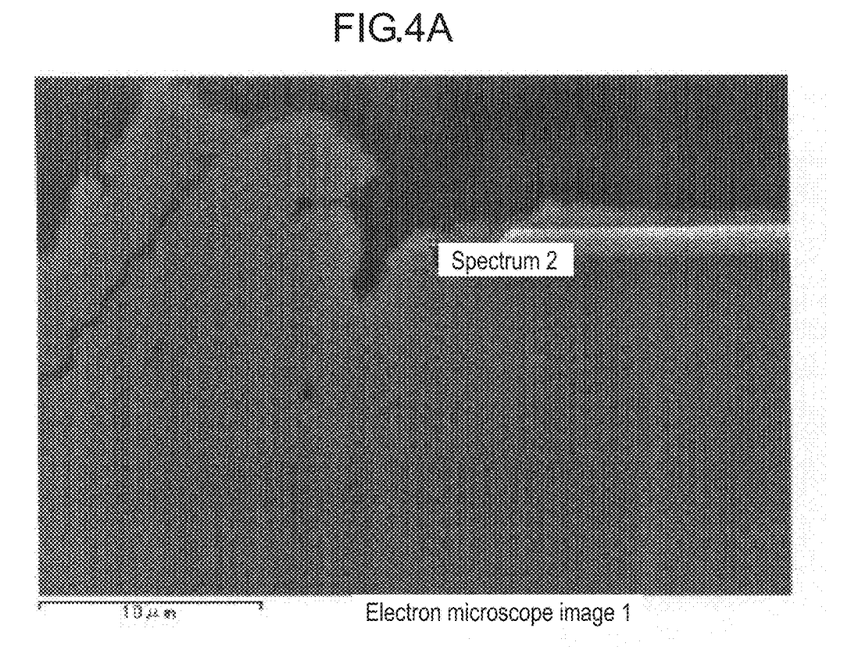
FIG. 4A is a view showing a photograph of a cross-section around a scribe lane in which structure bodies for suppressing chipping, crystal defects, and moisture penetration have been formed by fusion, reaction, and making an amorphous state down to a silicon substrate using a laser beam.
Figure 4B:
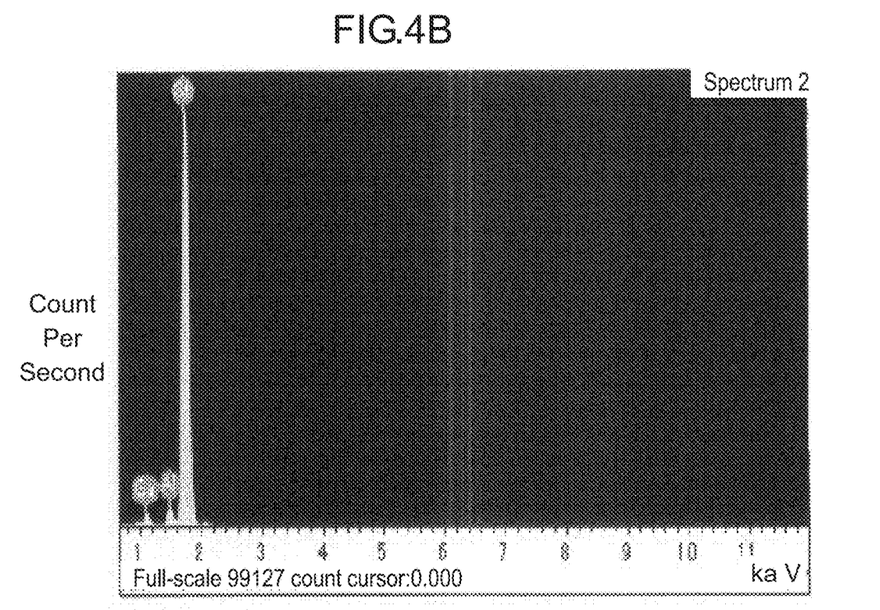
FIG. 4B is a view showing a result of element analysis around a scribe lane in which structure bodies for suppressing chipping, crystal defects, and moisture penetration have been formed by fusion, reaction, and making an amorphous state down to a silicon substrate using a laser beam.
Figure 4C:
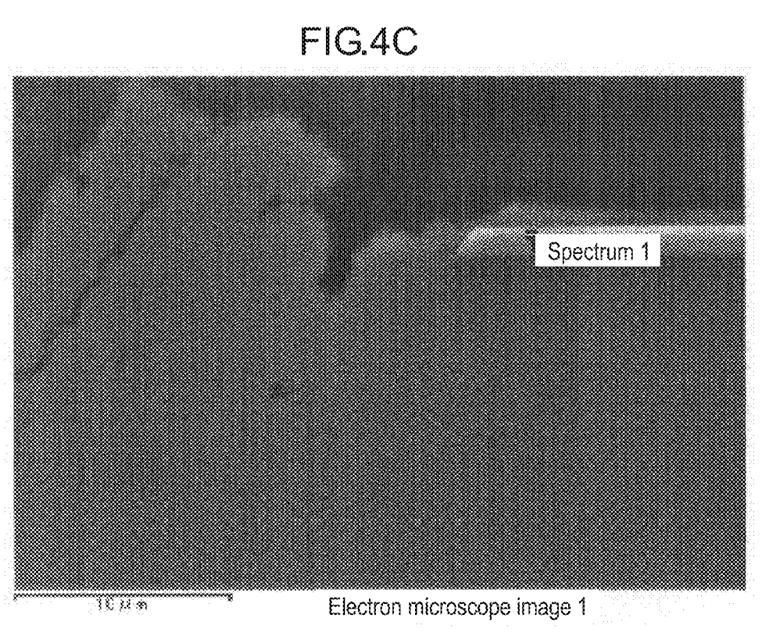
FIG. 4C is a view showing a photograph of a cross-section around a scribe lane in which structure bodies for suppressing chipping, crystal defects, and moisture penetration have been formed by fusion, reaction, and making an amorphous state down to a silicon substrate using a laser beam.
Figure 4D:
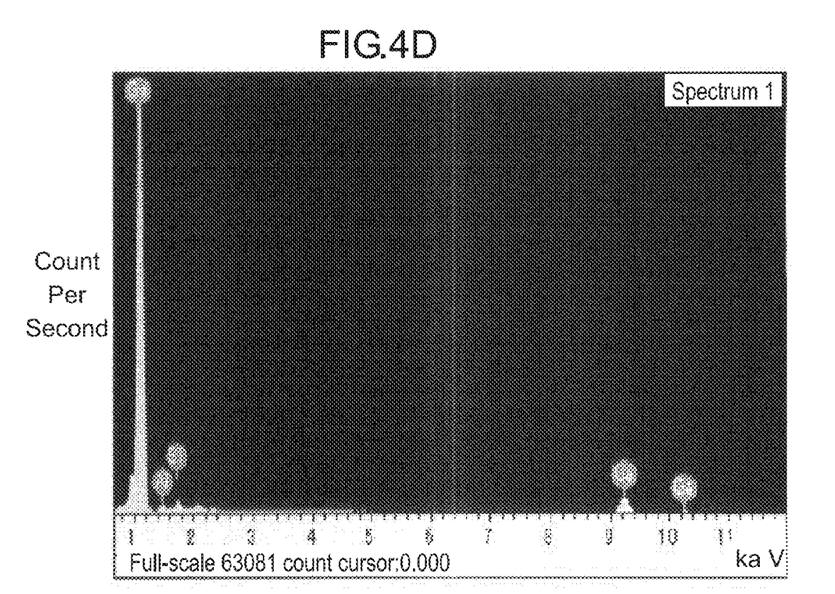
FIG. 4D is a view showing a result of element analysis around a scribe lane in which structure bodies for suppressing chipping, crystal defects, and moisture penetration have been formed by fusion, reaction, and making an amorphous state down to a silicon substrate using a laser beam.
Figure 4E:
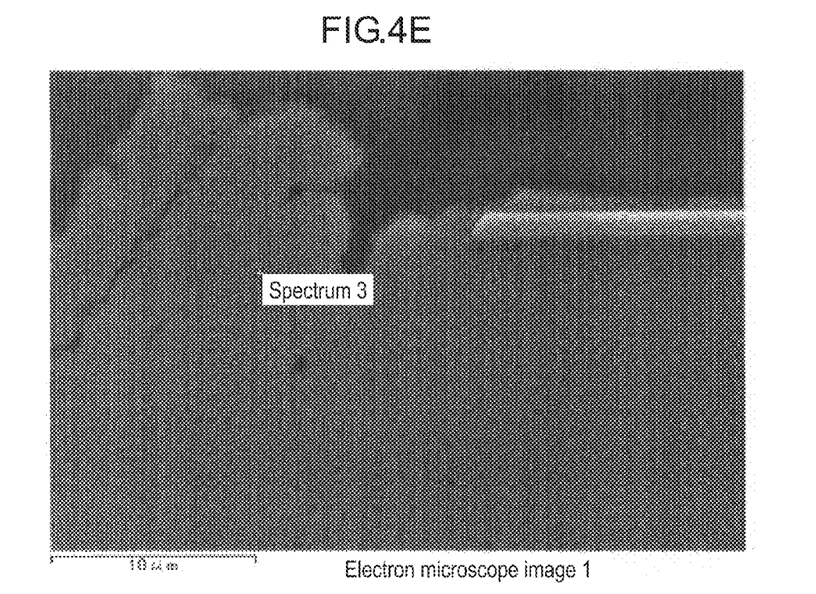
FIG. 4E is a view showing a photograph of a cross-section around a scribe lane in which structure bodies for suppressing chipping, crystal defects, and moisture penetration have been formed by fusion, reaction, and making an amorphous state down to a silicon substrate using a laser beam.
Figure 4F:
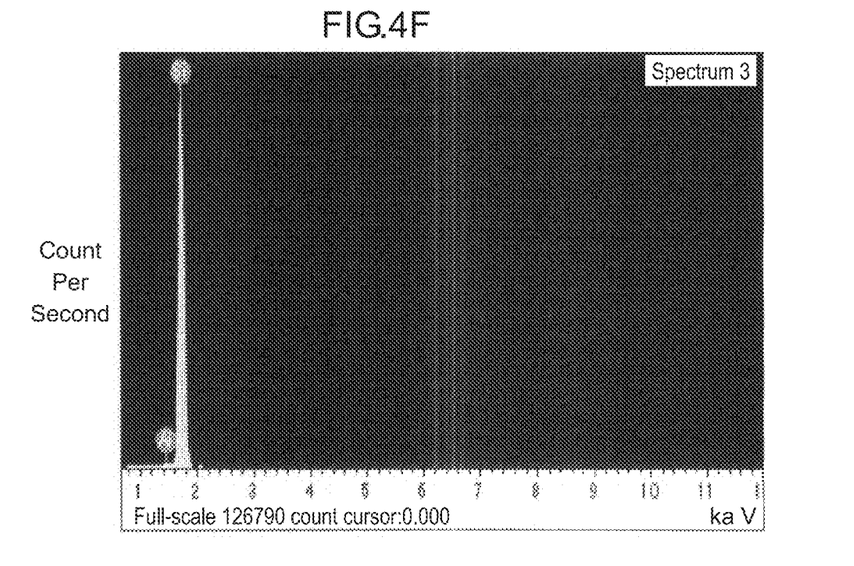
FIG. 4F is a view showing a result of element analysis around a scribe lane in which structure bodies for suppressing chipping, crystal defects, and moisture penetration have been formed by fusion, reaction, and making an amorphous state down to a silicon substrate using a laser beam.
Figure 4G:
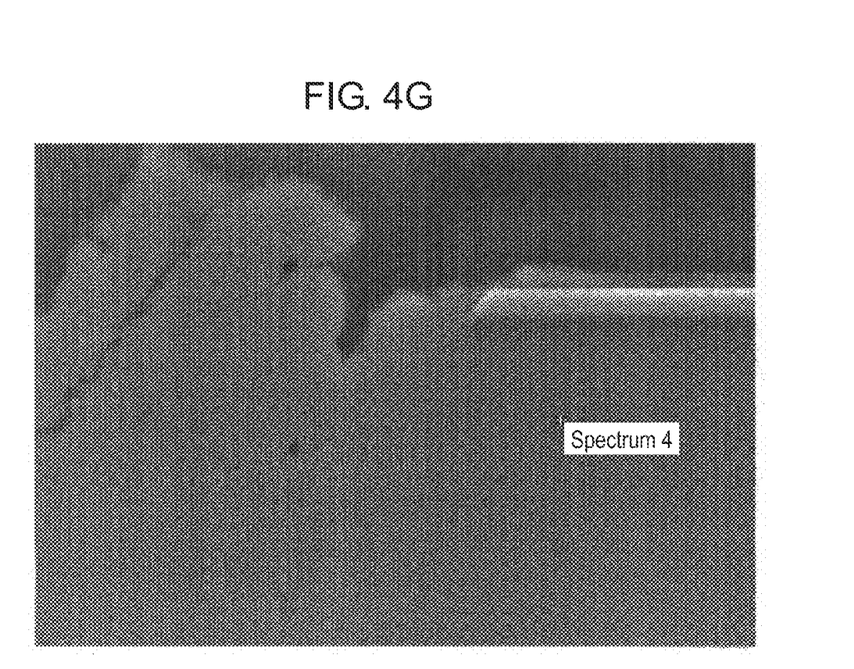
FIG. 4G is a view showing a photograph of a cross-section around a scribe lane in which structure bodies for suppressing chipping, crystal defects, and moisture penetration have been formed by fusion, reaction, and making an amorphous state down to a silicon substrate using a laser beam.
Figure 4H:
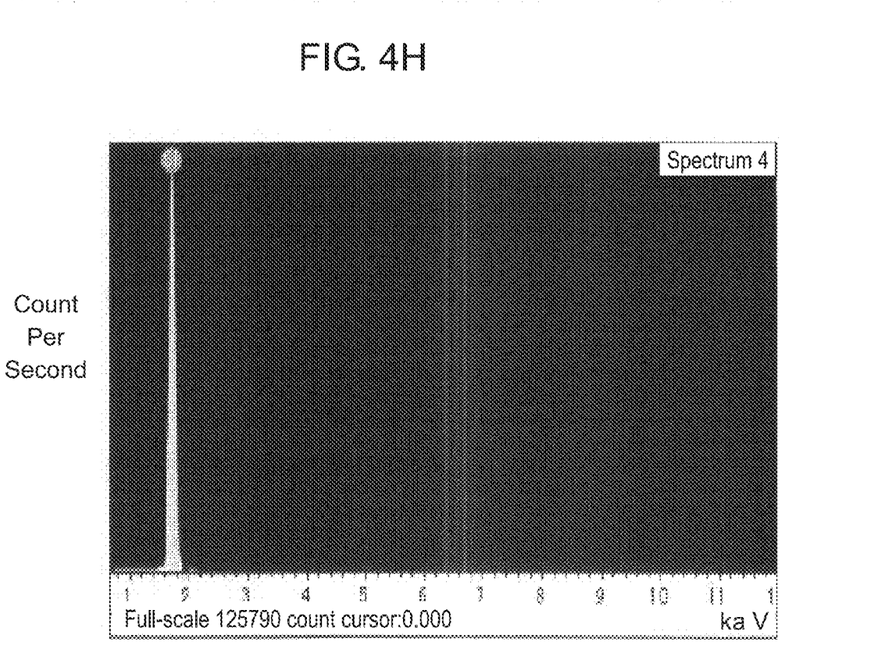
FIG. 4H is a view showing a result of element analysis around a scribe lane in which structure bodies for suppressing chipping, crystal defects, and moisture penetration have been formed by fusion, reaction, and making an amorphous state down to a silicon substrate using a laser beam.

FIGS. 4A, 4C, 4E, and 4G are views each showing a photograph of a cross-section around a scribe lane in which structure bodies for suppressing chipping, crystal defects, and moisture penetration have been formed by fusion, reaction, and making an amorphous state down to silicon substrate 1 using a laser beam. FIGS. 4B, 4D, 4F, and 4H are views each showing a result of element analysis around a scribe lane in which structure bodies for suppressing chipping, crystal defects, and moisture penetration have been formed by fusion, reaction, and making an amorphous state down to silicon substrate 1 using a laser beam. A second spectrum shown in FIGS. 4A and 4B and a third spectrum shown in FIGS. 4E and 4F show element analysis data (EDX (Energy Dispersive X-ray) method) of second structure body 12 and third structure body 13. A first spectrum shown in FIGS. 4C and 4D shows element analysis data (EDX method) of nitride-based semiconductor layer 2. A fourth spectrum shown in FIGS. 4G and 4H shows element analysis data (EDX method) of silicon substrate 1. From the second spectrum and the third spectrum, it will be understood that second structure body 12 and third structure body 13 contain silicon and aluminum. Also, in the present data, silicon is a major constituent element, where the second spectrum shows 25.57 at %, and the third spectrum shows 81.35 at %.

Here, in the present exemplary embodiment, an example using silicon substrate 1 has been described. However, even with use of a sapphire substrate or a silicon carbide substrate, a large stress is generated due to difference in lattice constant or thermal expansion coefficient when a nitride-based semiconductor layer is grown on the substrate. Therefore, even when such a substrate is used, a similar effect can be obtained by forming first structure body 11, second structure body 12, third structure body 13, and fourth structure body 14 that suppress the chipping, crystal defects, and moisture penetration along the scribe lane, in the same manner as in the above-described exemplary embodiment.

At the time of fusion, reaction, and making an amorphous state down to silicon substrate 1 using a laser beam, a protection coating film can be simultaneously formed at the end of the aluminum nitride layer when conditions for allowing the protection coating film to re-adhere to the end of the aluminum nitride layer by ablation phenomenon (tripled YAG laser (wavelength of the laser beam being 355 nm)) are selected, whereby an increase in the number of production steps and an increase in the production costs can be restrained to a minimum degree.

The nitride-based semiconductor layer of the compound semiconductor device according to the disclosure of the present application may be formed to extend across the semiconductor element formation region and the scribe lane on silicon substrate 1. This allows that the chipping, crystal defects, and the like can be prevented well by the structure bodies that suppress the chipping, crystal defects, and moisture penetration.

The structure bodies that suppress the chipping, crystal defects, and moisture penetration are preferably formed in a line shape along a boundary between the semiconductor element formation region and the scribe lane. This allows that the chipping, crystal defects, and the like can be prevented while suppressing the width of the scribe lane to be small.

The above structure bodies that suppress the chipping, crystal defects, and moisture penetration may also have a configuration of having a region that has been turned amorphous, having a protection coating film at the end of the aluminum nitride layer, or having a region obtained by surface-roughening (0.05 μm to 1.0 μm) of the nitride-based compound semiconductor.

The above structure bodies that suppress the chipping, crystal defects, and moisture penetration can produce similar effects even when a region is formed by fusion, reaction, and making an amorphous state down to silicon substrate 1 using a laser beam.

The above structure bodies that suppress the chipping, crystal defects, and moisture penetration can produce similar effects even by allowing a compound having a similar effect to re-adhere to a sidewall by using plasma etching method.

The structure bodies that suppress the chipping, crystal defects, and moisture penetration, though being formed at an end of the nitride-based semiconductor layer, have a groove/recess that reaches silicon substrate 1, so that damages at the time of dicing are less likely to be propagated to the nitride-based semiconductor layer, and the effect of the function of suppressing the chipping, crystal defects, and moisture penetration is large.

Therefore, even when chipping, crystal defects, and the like are generated near the interface between the substrate and the nitride-based semiconductor layer, the chipping, crystal defects, and the like are prevented from spreading to the semiconductor element side, so that electrical deficiency of the semiconductor element in the semiconductor device is eliminated. Simultaneously, reliability is improved, and further, yield of the semiconductor device is improved. Because there is no need to set the width of the scribe lane to be large, the number of semiconductor devices per wafer can be ensured.

The nitride-based compound semiconductor device, the method for producing the same, and the resin-sealed type semiconductor device according to the disclosure of the present application provide an advantage such that, even when a semiconductor device in which a nitride-based semiconductor layer is formed on a semiconductor wafer such as a silicon substrate is used, the chipping, crystal defects, and moisture in the dicing step can be prevented from reaching the active region of the element without increasing the width of the scribe lane, whereby the electric characteristics and reliability of the semiconductor device can be ensured.

Therefore, the present disclosure provides a technique useful in achieving a semiconductor device for electric power that has a high breakdown voltage.

What is claimed is:

1. A compound semiconductor device comprising:
a chip substrate being a base of a compound semiconductor chip;
an aluminum nitride layer disposed above the chip substrate;
a compound semiconductor layer disposed above the aluminum nitride layer; and
an element placed on an upper surface of the compound semiconductor layer,
wherein at least one of side surfaces of the aluminum nitride layer is entirely covered by an amorphous layer or a polycrystal layer,
the at least one of side surfaces is arranged along an outer periphery of the chip substrate,
the amorphous layer or the polycrystal layer includes aluminum,
the chip substrate has a first recess along the outer periphery of the chip substrate, and
the amorphous layer or the polycrystal layer is in contact with the first recess.

2. The compound semiconductor device according to claim 1, wherein the chip substrate is made of any one of silicon, silicon carbide, and sapphire.

3. The compound semiconductor device according to claim 1, wherein the amorphous layer or the polycrystal layer further includes silicon.

4. The compound semiconductor device according to claim 3, wherein the amorphous layer or the polycrystal layer contains silicon at not less than 1 at %.

5. The compound semiconductor device according to any one of claims 1, 3 or 4, wherein the amorphous layer or the polycrystal layer has peaks and valleys with an average pitch of 0.05 µm to 1.0 µm on a surface of the amorphous layer or the polycrystal layer.

6. A resin-sealed type semiconductor device wherein the amorphous layer or the polycrystal layer of the compound semiconductor device according to any one of claims 1, 3 or 4 is in contact with a resin agent for assembly for one of the amorphous layer or the polycrystal layer to be under-filled or side-filled by mold resin sealing, incorporation into a component-incorporated substrate, or flip-chip mounting.

7. The compound semiconductor device according to claim 1, wherein the amorphous layer or the polycrystal layer entirely covers all of the side surfaces of the aluminum nitride layer, and
all of the side surfaces are arranged along the outer periphery of the chip substrate.

8. The compound semiconductor device according to claim 7, wherein the amorphous layer or the polycrystal layer has peaks and valleys with an average pitch of 0.05 µm to 1.0 µm on a surface of the amorphous layer or the polycrystal layer.

9. The compound semiconductor device according to claim 1, wherein the aluminum nitride layer has a second recess along the outer periphery of the chip substrate, and
the second recess is closer to the element than the first recess.

10. The compound semiconductor device according to claim 9, wherein the chip substrate is made of any one of silicon, silicon carbide, and sapphire.

11. A resin-sealed type semiconductor device wherein the amorphous layer or the polycrystal layer of the compound semiconductor device according to claim 9 is in contact with a resin agent for assembly for one of the amorphous layer or the polycrystal layer to be under-filled or side-filled by mold resin sealing, incorporation into a component-incorporated substrate, or flip-chip mounting.

12. A method for producing a compound semiconductor device, wherein the compound semiconductor device includes a chip substrate being a base of a compound semiconductor chip, an aluminum nitride layer disposed above the chip substrate, a compound semiconductor layer disposed above the aluminum nitride layer and an element placed on an upper surface of the compound semiconductor layer, the method comprising:
irradiating a laser beam along a scribe lane of the compound semiconductor device to entirely cover at least one of side surfaces of the aluminum nitride layer by an amorphous layer or a polycrystal layer,
wherein the at least one of side surfaces is arranged along an outer periphery of the chip substrate, and
the amorphous layer or the polycrystal layer includes aluminum.

* * * * *